United States Patent
Gronenborn

(10) Patent No.: US 12,355,215 B2
(45) Date of Patent: Jul. 8, 2025

(54) LIGHT SOURCE, SENSOR AND METHOD OF ILLUMINATING A SCENE

(71) Applicant: TRUMPF Photonic Components GmbH, Ulm (DE)

(72) Inventor: Stephan Gronenborn, Aachen (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 677 days.

(21) Appl. No.: 17/726,544

(22) Filed: Apr. 22, 2022

(65) Prior Publication Data

US 2022/0247158 A1    Aug. 4, 2022

Related U.S. Application Data

(63) Continuation of application No. PCT/EP2020/078449, filed on Oct. 9, 2020.

(30) Foreign Application Priority Data

Oct. 30, 2019 (EP) .................................. 19206268

(51) Int. Cl.
*H01S 5/42* (2006.01)
*G01S 7/481* (2006.01)
(Continued)

(52) U.S. Cl.
CPC ............ *H01S 5/423* (2013.01); *G01S 7/4815* (2013.01); *G01S 7/4865* (2013.01); *G01S 17/10* (2013.01); *G01S 17/894* (2020.01)

(58) Field of Classification Search
CPC ...... H01S 5/423; G01S 7/4815; G01S 7/4865; G01S 17/10; G01S 17/894;
(Continued)

(56) References Cited

U.S. PATENT DOCUMENTS

2003/0063391 A1* 4/2003 Wang ................... B41J 2/451
359/619
2012/0281293 A1 11/2012 Gronenborn et al.
(Continued)

FOREIGN PATENT DOCUMENTS

| CN | 101052910 A | 10/2007 |
|---|---|---|
| CN | 102742100 A | 10/2012 |

(Continued)

*Primary Examiner* — Xinning(Tom) Niu
(74) *Attorney, Agent, or Firm* — LEYDIG VOIT & MAYER LTD.

(57) ABSTRACT

A light source comprises an array of Vertical Cavity Surface Emitting Lasers (VCSELs) and an optical member. The array comprises at least two sub-arrays. The sub-arrays are displaced with respect to one another along a first axis. The optical member is configured as a single optical element and configured to transform light emitted by the sub-arrays into substantially parallel illumination lines in a target area. The illumination lines are arranged along the first axis. Each illumination line has a width in a direction of the first axis and a length in a direction of a second axis perpendicular to the first axis. The width is smaller than the length. The optical member has facets in the direction of the second axis. Each facet has a size in the direction of the second axis which is smaller than a size of a sub-array in the direction of the second axis.

15 Claims, 8 Drawing Sheets

(51) Int. Cl.
  *G01S 7/4865* (2020.01)
  *G01S 17/10* (2020.01)
  *G01S 17/894* (2020.01)

(58) Field of Classification Search
  CPC ............ G01B 11/2513; G02B 19/0014; G02B 19/0057; G02B 27/0961
  See application file for complete search history.

(56) References Cited

U.S. PATENT DOCUMENTS

| | | |
|---|---|---|
| 2013/0038719 A1 | 2/2013 | Canini et al. |
| 2015/0260830 A1* | 9/2015 | Ghosh ..................... G01S 7/484 250/208.1 |
| 2015/0323152 A1 | 11/2015 | Mayer et al. |
| 2016/0072258 A1* | 3/2016 | Seurin .................. G06V 20/698 362/11 |
| 2016/0197452 A1 | 7/2016 | Mor |
| 2018/0143012 A1 | 5/2018 | Ansari et al. |
| 2018/0288388 A1 | 10/2018 | Hicks |
| 2019/0249984 A1* | 8/2019 | Barlev ..................... G06T 7/55 |

FOREIGN PATENT DOCUMENTS

| | | |
|---|---|---|
| CN | 102870121 A | 1/2013 |
| CN | 109541817 A | 3/2019 |
| EP | 2827175 A2 | 1/2015 |
| EP | 3451470 A1 | 3/2019 |
| TW | 201909501 A | 3/2019 |
| WO | WO 2006066706 A2 | 6/2006 |

* cited by examiner

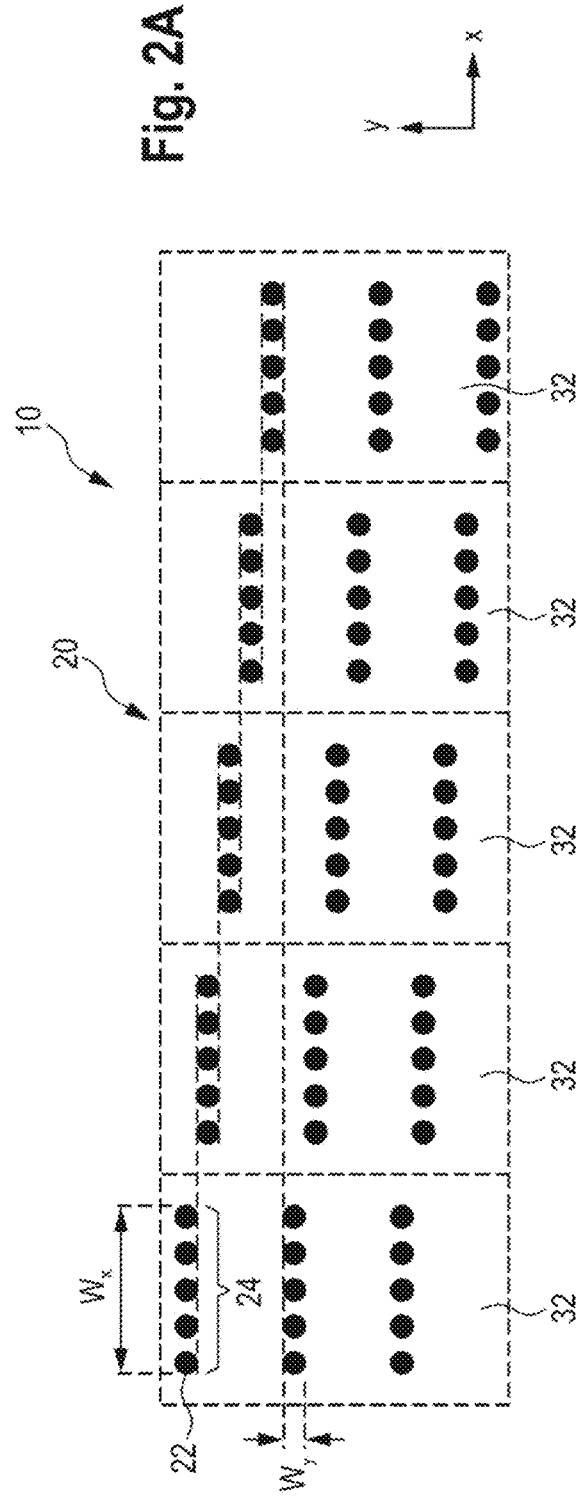
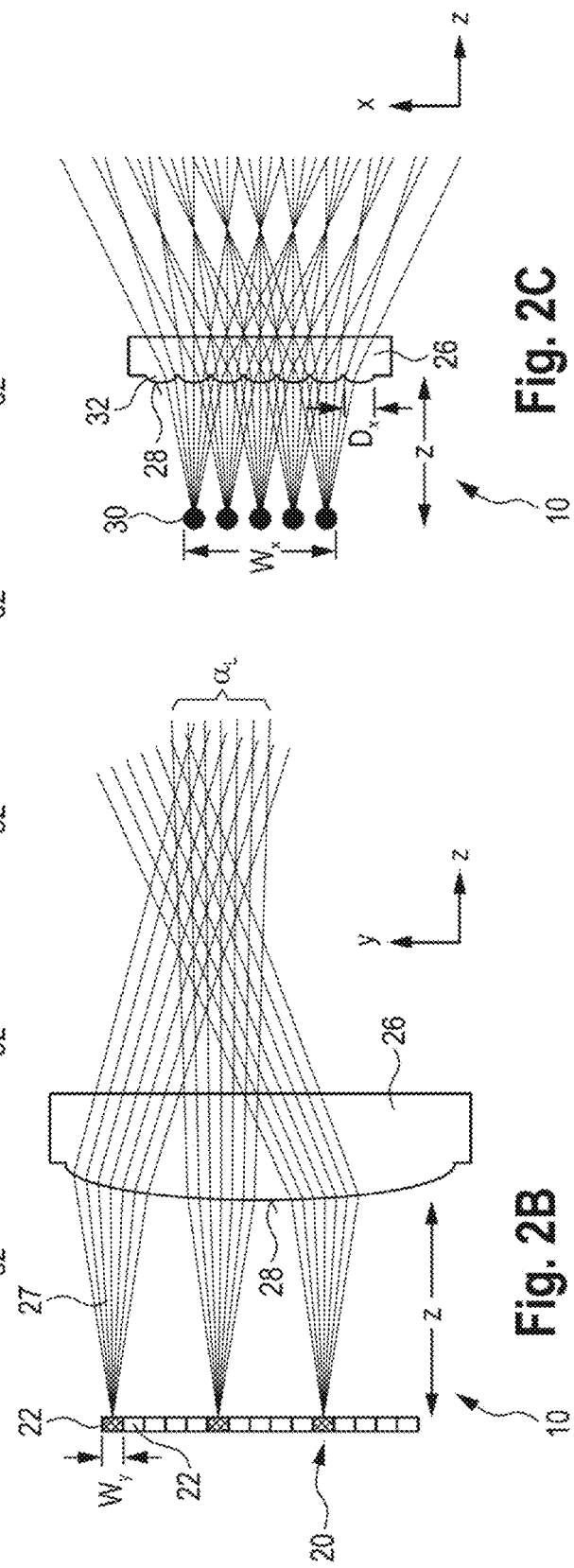
Fig. 2A
Fig. 2B
Fig. 2C

LIGHT SOURCE, SENSOR AND METHOD OF ILLUMINATING A SCENE

CROSS REFERENCE TO RELATED APPLICATIONS

This application is a continuation of International Application No. PCT/EP2020/078449 (WO 2021/083641 A1), filed on Oct. 9, 2020, and claims benefit to European Patent Application No. EP 19206268.5, filed on Oct. 30, 2019. The aforementioned applications are hereby incorporated by reference herein.

FIELD

Embodiments of the present invention relate to a light source comprising Vertical Cavity Surface Emitting Lasers (VCSELs) as light emitting elements. Embodiments of the present invention further relate to a sensor with a light source. Embodiments of the present invention further relate to a method of illuminating a scene, in particular for sensing applications.

BACKGROUND

Light sources comprising a VCSEL array can be used as illumination devices, e.g. for infrared illumination. Using short pulses, VCSEL arrays may be applied in sensors for time-of-flight applications. Such applications comprise, e.g. short-range gesture recognition for portable devices and 3D space recognition. VCSEL arrays of about 1 mm$^2$ area with output power in the 1-10 W range are envisaged nowadays. A specific field of illumination may be defined by the application of the sensor, e.g. a time-of-flight camera observing e.g. a 70°×50° field. For a standard time-of-flight camera a homogeneous illumination with a fast-pulse pattern is desired. Advanced time-of-flight methods may use in addition addressable illumination zones to provide higher peak powers and lower the power consumption of the signal readout. This allows e.g. for better measurement accuracy of the distance or longer range compared to the standard approach. At present, light sources to create homogeneous, individually addressable zones with simple low cost optics and small building height are not available. In contrast, prior art light sources would require complex, bulky optics and/or moving parts, like a MEMS mirror.

US 2018/0143012 discloses a device with curved arrays of individually addressable light-emitting elements for sweeping out angular ranges. The device also includes a curved optical element concentrical with the curved array of light emitting elements. The curved optical element is arranged to focus light emitted from each individually addressable light-emitting element to produce a substantially linear illumination pattern.

US 2018/0288388 A1 discloses a projector to incrementically project a point or speckle pattern over a scene within an image sensor FOV.

SUMMARY

Embodiments of the present invention provide a light source that comprises an array of Vertical Cavity Surface Emitting Lasers (VCSELs) and an optical member. The array comprises at least two sub-arrays. The sub-arrays are displaced with respect to one another along a first axis. The optical member is configured as a single optical element and configured to transform light emitted by the sub-arrays into substantially parallel illumination lines in a target area. The illumination lines are arranged along the first axis. Each illumination line has a width in a direction of the first axis and a length in a direction of a second axis perpendicular to the first axis. The width is smaller than the length. The optical member has facets in the direction of the second axis. Each facet has a size in the direction of the second axis which is smaller than a size of a sub-array in the direction of the second axis.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 2A shows a front view of an embodiment of a light source for generating an illumination pattern consisting of illumination lines;

FIG. 2B shows a side view of the light source in FIG. 2A;

FIG. 2C shows a top view of the light source in FIGS. 2A and 2B;

in FIGS. 2A to 2C;

DETAILED DESCRIPTION

Figure 1:
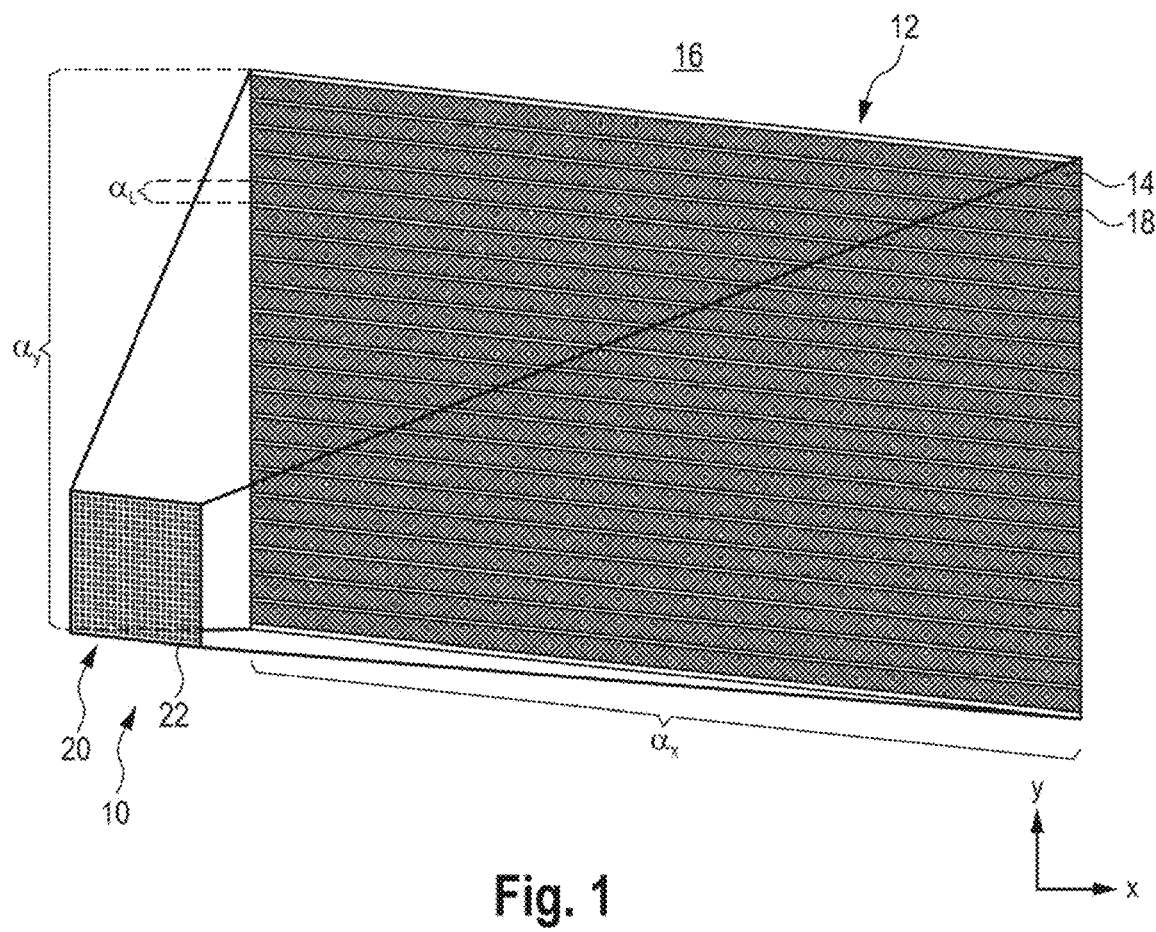
FIG. 1 shows a principle sketch of a light source for generating an illumination pattern consisting of a plurality of illumination lines.

Embodiments of the present invention provide a light source by which homogeneous, individually addressable illumination zones may be created.

Embodiments of the present invention further provide a light source which is of low cost and has small building height, and which has simple optics which is not bulky and does not require moving parts.

Embodiments of the present invention also provide a sensor having a light source.

Embodiments of the present invention also provide a method of illuminating a scene.

According to a first aspect, a light source is provided, comprising an array of Vertical Cavity Surface Emitting Lasers (VCSELs), the array comprising at least two sub-arrays, each sub-array comprising at least one VCSEL, the sub-arrays being displaced with respect to one another along a first axis, the sub-arrays being configured to individually emit light, and an optical member configured as a single optical element and configured to transform light emitted by the sub-arrays into substantially parallel illumination lines in a target area, wherein the illumination lines are arranged along the first axis, each illumination line having a width in direction of the first axis and a length in direction of the second axis perpendicular to the first axis, wherein the width is smaller than the length. If the sub-arrays have more than one VCSEL per sub-array, the VCSELs of a sub-array are arranged along the second axis.

The optical member may be a transmissive optical member, and may be configured as a lens with curved surface(s), or a diffractive element, or a GRIN (graded index) lens, or as a meta-lens.

According to embodiments of the present invention, a light source is proposed which uses a VCSEL array with an optical member to realize illumination of a scene, wherein the illumination consists of several, individually addressable illumination lines. To this end, the VCSEL array comprises at least two sub-arrays. The term "sub-array" as used in the present disclosure does not necessarily mean that the sub-array comprises a plurality of VCSELs, but includes also the case that it includes one VCSEL. With at least two sub-arrays each including at least one VCSEL, at least two illumination lines may be created in the target area of illumination. Typically, a VCSEL may be considered as a quasi-punctiform light emitting element which emits a slightly diverging light cone. The light cones of the VCSELs pass through the transmissive optical member, which transforms the light emitted by the sub-arrays into substantially parallel illumination lines in the target area. Each illumination line has a width in direction of the first axis along which the sub-arrays are displaced with respect to one another. The width direction of each illumination line is also referred to as the "short dimension" of the illumination line or, for the sake of simplicity, the y-direction. Accordingly, the first axis is also referred to as the y-axis in the present disclosure. Each illumination line has a length in direction of a second axis perpendicular to the first axis. The length direction of the illumination lines is also referred to as the "long dimension" of the illumination lines and, for the sake of simplicity, is also referred to as the x-direction. Accordingly, the second axis is also referred to as the x-axis in the present disclosure. Transformation of the light emitted by the sub-arrays thus occurs in direction of the y-axis and in direction of the x-axis. The light transformation preferably is such that the illumination lines have no or little distortion.

The entirety of the illumination lines generated by the sub-arrays in combination with the optical member spans the entire illumination field which may be adapted to the field of view of e.g. a time-of-flight camera. At least a part of the sub-arrays are individually addressable, i.e. can be driven independently from each other to generate individually addressable illumination lines in the target area. Thus, the light source is adapted to generate a sub-set of one or more illumination lines among the entirety of illumination lines the light source is able to generate. This enables higher peak powers in the illumination line(s) currently generated and lowers the power consumption of the signal readout of a sensor, e.g. a time-of-flight camera.

The optical member is a single optical element, which may be one-piece or monolithic, and which combines the capabilities to transform the light emitted by the sub-arrays in both, the x- and y-axis, into the illumination lines in the target area. This measure provides simple, not bulky and low cost optics. The single one-piece optical element may be integrated in the VCSEL array chip or may be arranged in a distance from the VCSEL array.

The illumination lines preferably have a smooth intensity distribution in the long dimension (x-dimension) and a more or less sharply-edged intensity distribution in the short dimension (y-dimension). In case that the sub-arrays have more than one VCSEL per sub-array, which VCSELs typically have discrete positions with a gap between adjacent VCSELs, the illumination lines have a smooth intensity distribution along their length without dark zones. The length of the illumination lines may be one or more magnitudes larger than the width of the illumination lines. For example, each illumination line may have a length which is larger by a factor of at least 3, e.g. at least 10, in particular of at least 20 or by a factor of around 30, than the width of the illumination line.

Preferred embodiments of the light source will be described hereinafter. Preferred embodiments are not only those indicated in the dependent claims, but also those indicated in the entire disclosure herein.

In one embodiment, the optical member may be configured as an imaging lens or collimating lens in direction of the first axis, and as a diffusor in direction of the second axis.

Basically, the optical member may be imaging or collimating in the first direction (short dimension) and at the same time diffusing in the second direction (long dimension). Collimating the light emitted by the sub-arrays may be advantageous for applications in which the target area is spaced apart from the light source by a distance of e.g. 100 m.

Further, the optical member of the light source according to embodiments of the present invention may have the capability to generate the illumination lines densely packed in the target area, i.e. with no or only very small gaps in the short dimension between adjacent illumination lines. Densely packed illumination lines may be advantageous because each point in the scene is illuminated by at least one illumination line.

The optical member of the light source according to embodiments of the present invention has the capability of smoothing or may even homogenize the light intensity distribution along the length of the illumination line without significant or even no intensity variations along the length of the illumination line.

Thus, in one embodiment, the optical member may be configured to generate the illumination lines with homogeneous light intensity distribution in direction of the second axis. The light intensity distribution of the illumination lines may be homogeneous in terms of angular intensity or in terms of irradiance in the target area.

In another embodiment, the optical member may be configured to generate the illumination lines with a light intensity distribution in direction of the second axis, wherein the light intensity increases toward the ends of the illumination lines.

Illumination lines with an increasing intensity distribution or irradiance towards the ends of the illumination lines or, in other words, towards large angles may be advantageous to compensate for angle-dependent losses of a receiver objective of e.g. a time-of-flight camera. In embodiments, the light intensity distribution may increase towards increasing angles according to $\cos^{-4}$.

In an embodiment, the optical member may be configured to generate illumination lines with substantially top hat light intensity distribution in direction of the first axis. When the illumination lines have a top hat shaped light intensity distribution or at least a substantially top hat light intensity distribution in the short dimension, the scene may be illuminated in direction of the Y-axis with a homogeneous light intensity distribution, when the illumination lines are densely packed without or with no significant gaps between adjacent illumination lines.

In an embodiment, the optical member may have an optically effective surface, wherein the surface shape in a cross-section along a plane including the first axis and a third axis perpendicular to the first and second axis is aspheric, in particular has the shape of a conic section. In this embodiment, the imaging or collimating properties of the optical member are conferred by at least one curved, in particular convexly curved surface of the optical member.

In direction of the x-axis, the optically effective surface may also be aspheric, in particular conic in cross-section including the second axis and the third axis. In this embodiment, the optical member is a single bi-conic lens element. The surface shape of the optically effective surface may differ in direction of the first axis from the surface shape in direction of the second axis with respect to radius of curvature and/or conical constant and/or aspheric constants.

The afore-mentioned different optical transformation properties are adapted to the light intensity distribution to be obtained in each of the illumination lines. The conical constant and/or the aspherical constants may be optimized to achieve low distortion of the illumination lines and a desired radial intensity profile in the target area. For example, a conical constant of approximately −1 results in homogeneous irradiance on a flat screen. The radius of curvature may be adapted to image the light emitted by the sub-arrays to the scene, or collimate the light emitted by the sub-arrays, if the target area is in infinity.

As an alternative to the design of the optical member as a lens with curved surface(s), the optical member may be designed as a meta-lens comprising a meta-structure in the nano-scale regime, which exhibits a refractive index distribution over its two-dimensional area, which provides for the imaging or collimating properties of the optical member in the y-direction and the diffusor properties in the x-direction.

In an embodiment, the sub-arrays may be displaced with respect to one another along the second axis. In this embodiment, the sub-arrays are displaced with respect to one another along the first axis as well as along the second axis.

This embodiment is suitable to obtain densely packed illumination lines in the target area. It is known that sub-arrays of VCSELs cannot be that densely packed in the y-direction, as there is some space needed between the individual VCSELs and especially more space for electrical contacts, e.g. bond pads, solder bumps, etc. By shifting the sub-arrays along the x-axis, the sub-arrays may be much closer arranged to one another in direction of the first axis, as will be described herein.

In another embodiment, the optical member may have first facets arranged along the direction of the first axis, wherein each first facet of the optical member transforms light emitted by one of the sub-arrays with respect to the first axis. The facets may have curved surfaces with different curvatures, or the facets may be designed as portions of a meta-lens with different refractive index distributions among each other.

This embodiment also solves the problem to generate packed illumination lines although the sub-arrays may not be that densely packed on the VCSEL chip. In this embodiment, it is not necessary to displace the sub-arrays with respect to one another along the second axis. In fact, the first facets may re-direct the light emitted by the individual sub-arrays such that the illumination lines in the target area are arranged close to one another, i.e. side-by-side without gaps or only very small gaps almost. The size of each of the lens facet apertures in the Y-direction should be large enough to cover a large fraction of the beam emitted by the corresponding sub-array, preferably the full beam.

A further embodiment may provide that the first facets are decentered with respect to the sub-arrays in direction of the first axis. This embodiment may improve the capability of the optical member to transform the light emitted by the sub-arrays such that the generated illumination lines are arranged close to one another, in particular without gaps between adjacent illumination lines in the target area.

In an embodiment, the optical member may have second facets in direction of the second axis, wherein each second facet has a size in direction of the second axis which is smaller, in particular much smaller, than the size of the sub-arrays in direction of the second axis. Again, the second facets may be designed having curved surface(s), or as facets comprising meta-material.

In this embodiment, the optical member is faceted in the long dimension of the illumination lines. Since the second facets have a size in the long dimension which is smaller than a size of the VCSEL sub-array in the long dimension, the second facets have a diffusing effect on the light emitted by the sub-arrays in the long dimension. Preferably, the size of the second facets in the long dimension is much smaller than the size of the VCSEL sub-array in the long dimension. This may ensure that most of the second lens facets are illuminated homogeneously, and this enables the homogeneous distribution of the target profile within the long dimension. One or multiple of the second lens facets may be arranged in front of each sub-array in the long dimension. The second facets may be decentered with respect to the VCSELs. In case that the optical member has first facets arranged along the short dimension, each illumination zone can have multiple second lens facets arranged in the long dimension, while the size of each first facet in the small dimension is large enough to cover the full beam of the corresponding sub-array.

In an embodiment, the optical member may be arranged in a distance from the sub-arrays in direction of light emission which distance substantially equals the focal length of the optical member with respect to the light transformation with respect to the first axis, and which is greater than the focal length of the optical member with respect to light transformation with respect to the second axis.

The focal length of the optical member with respect to light transformation with respect to the second axis (long dimension) may be the focal length of each of the second facets the optical member may have according to an embodiment described above.

When the optical member is spaced apart from the sub-arrays by its focal length in the y-direction, the optical member transforms the light cones emitted by the sub-arrays into collimated or converging light beams. Collimated light beams are suitable if the target area is in a large distance from the light source, e.g. 50 m or even 100 m or more. In this case, the optical member images the light emitted by the sub-arrays in the short dimension to infinity.

The array of the light source according to embodiments of the present invention may comprise at least five, preferably at least ten, further preferably at least twenty sub-arrays. The number of sub-arrays depends on the number of illumination lines to be generated by the light source in the target area. The number of illumination lines depends on the desired area of the illumination field, which in turn may depend on the field of view of a sensor used in combination with the light source.

Each sub-array of the VCSEL array may comprise at least two VCSELs arranged along the second axis. Each sub-array may comprise, for example, five or more VCSELs, wherein the VCSELs of each sub-array may be arranged in a row along the second axis.

According to a second aspect, a sensor comprising a light source of the first aspect and a detector for detecting light emitted by the light source and reflected or scattered from the target area is provided.

According to a third aspect, a method of illuminating a scene is provided, comprising:

providing a light source comprising an array of Vertical Cavity Surface Emitting Lasers (VCSELs), the array comprising at least two sub-arrays, each sub-array comprising at least one VCSEL, the sub-arrays being displaced with respect to one another along a first axis, the sub-arrays being configured to individually emit light, causing at least one of the sub-arrays to emit light, transforming the light emitted by the at least one sub-array into an illumination line in a target area, the illumination line having a width in direction of the first axis and a length in direction of a second axis perpendicular to the first axis, wherein the width is smaller than the length.

It is to be understood that the sensor according to the second aspect and the method according to the third aspect have the same or similar advantages and embodiments as described with respect to the light source according to the first aspect.

Further advantages and embodiments are defined below.

FIG. 1 shows a principle sketch of a light source 10 generating an illumination pattern 12 consisting of a plurality of illumination lines 14 in a target area 16. The target area 16 may be arbitrary, e.g. a landscape, one or more objects, e.g. moving objects like vehicles, persons, persons making gestures, or the like. The target area 16 may be remote from the light source 10, for example spaced apart from the light source 10 in a distance of several meters up to several hundred meters.

The light source 10 may be used in a sensor 100 (FIG. 8), e.g. for sensing distances, velocities, 3D profiles of objects or landscapes, or for sensing gestures. The sensor 100 may be a time-of-flight camera.

The light source 10 comprises an array 20 of Vertical Cavity Surface Emitting Lasers (VCSELs) 22 configured to emit light, e.g. in the infrared wavelength range.

The illumination lines 14 of the illumination pattern 12 are substantially parallel with respect to one another. In the embodiment shown, the illumination lines 14 are straight. The illumination lines may also be curved, which also includes that the illumination lines are parallel in that they are concentric. Further, the illumination lines 14 are densely packed, i.e. arranged close to one another, with very small gaps 18 between immediately adjacent illumination lines 14, or even without any gaps between adjacent illumination lines 14. The illumination lines 14 may also have an overlap between adjacent illumination lines 14.

The illumination lines 14 are arranged in series along a first axis, which is also referred to herein as the y-axis. In direction of the y-axis, the illumination lines 14 have a width which may be as small as several millimeters up to several centimeters. In direction of a second axis perpendicular to the first axis, which is also referred to herein as the x-axis, the illumination lines 14 have a length, wherein the length is much greater than the width of the illumination lines 14. For example, the aspect ratio between the length and width of the illumination lines 14 may be greater than 5, e.g. greater than 10, e.g. about 30.

The light intensity distribution in the illumination lines 14 shall be smooth in direction of the x-axis, i.e. in the long dimension of the illumination lines. Especially, the light intensity distribution in the long dimension may be homogeneous in angular intensity or in irradiance in the target area 16. Alternatively, the light intensity distribution of the illumination lines 14 in their long dimension may have an increasing irradiance towards the large angles, i.e. towards the longitudinal ends of the illumination lines 14, e.g. according to $\cos^4$. The illumination lines are individually addressable, i.e. one or some of the illumination lines 14 may be generated at a time, while at the same time the other illumination lines 14 are not generated.

In direction of the y-axis, i.e. the short dimension of the illumination lines 14, the illumination lines 14 may have a light intensity distribution which is more or less sharp-edged, for example top-hat shaped.

In the following, embodiments of the light source 10 will be described in more detail with respect to the further drawings, wherein the same reference numerals label identical, similar or comparable elements of the embodiments and of FIG. 1.

FIG. 2A shows a front view of an embodiment of the light source 10 comprising an array 20 of VCSELs. Each VCSEL 22 is represented by a black dot in FIG. 2A. The array 20 comprises two or more sub-arrays 24. In the embodiment in FIG. 2A, the array 20 comprises 15 sub-arrays 24 as an example. Each sub-array 24 comprises one or more VCSELs 22. In the embodiment shown, each sub-array 24 comprises five VCSELs 22 as an example. While it is shown that each sub-array 24 comprises one row of VCSELs, it is also possible that one or more or all sub-arrays comprise(s) more than one row of VCSELs, eg. 2 or 3 rows.

The sub-arrays 24 are individually addressable, i.e. the VCSELs 22 of one sub-array 24 may be driven to emit light independently from the VCSELs of other sub-arrays 24. Each sub-array 24 of VCSELs 22, when emitting light, is arranged, in combination with an optical member 26 described below, for generating one illumination line in a target area.

In direction of the y-axis, the sub-arrays 24 are displaced with respect to one another. In direction of the x-axis, the sub-arrays 24 are also displaced with respect to one another. Such an arrangement of the sub-arrays is advantageous if the sub-arrays cannot be densely packed in direction of the y-axis side-by-side. On the other hand, it is preferred if the illumination lines 14 (e.g. FIG. 1) are densely packed as possible so that each point in the target area is illuminated by at least one illumination line, as shown in FIG. 1. Shifting the sub-arrays 24 in direction of the x-axis is one possibility to obtain densely packed illumination lines.

As shown in FIG. 2B and FIG. 2C, the light source 10 comprises an optical member 26. The optical member 26 is shown in the present embodiment as transmissive optical member. The optical member 26 is a single optical element. All optical functions to be performed by the optical member 26 and to be described below are thus combined in a single optical element. Light 28 emitted by the VCSELs 22 is transformed by the optical member 26 into the illumination lines, for example illumination lines 14 as shown in FIG. 1, with the desired light intensity distribution in the illumination lines as described above with reference to FIG. 1.

The optical member 26 may be designed on the basis of the desired illumination pattern consisting of the illumination lines like the illumination lines 14 in FIG. 1. In the present embodiment of FIG. 2A-2C, 15 illumination lines may be individually addressably generated by the array 20.

The design of the optical member may be based on the assumption that a target area like target area 16 shall be illuminated by N illumination lines and, further, on the assumption that the target illumination field shall cover a viewing angle $\alpha_x$ (see FIG. 1) in direction of the x-axis and a viewing angle $\alpha_y$ in direction of the y-axis (see FIG. 1). The angles $\alpha_x$ and $\alpha_y$ may be defined as the full-angle at 50% light intensity. Further, it may be assumed that the angular width of each illumination line is described by $\alpha_L$ in direction of the y-axis, then typically $\alpha_L = \alpha_y/N$, when no gaps shall be present between adjacent illumination lines 14.

The total height of the array 20 of the light source 10 in direction of the y-axis, denoted as $L_y$, can be calculated by multiplying the extension $w_y$ of one VCSEL sub-array 24 times the number of zones or illumination lines N. By virtue of the shift of the sub-arrays 24 also in direction of the x-axis as shown in FIG. 2A, the total height of the light source 10 in direction of the y-axis can be kept small despite the large number of illumination lines 14.

The optical member 26 may be a single lens. The optical member 26 is configured to transform the light emitted by the VCSELs 22 such that the illumination lines are generated with the desired intensity profile in direction of the x-axis and the y-axis. As described above, the light intensity distribution in direction of the x-axis shall be smooth, especially homogeneous or with increasing intensity towards the ends of the illumination lines in the x-direction, and more or less sharply edged in direction of the y-axis. The optical member 26 is designed to transform the light emitted by the individual sub-arrays 24 to the desired width $\alpha_L$ in the target area, e.g. a flat plane in 100 m distance from the light source 10.

The optical member 26 may be configured as an imaging or collimating lens in direction of the y-axis, and as a diffusor in direction of the x-axis. Collimating is advantageous in case of remotely spaced target areas, e.g. in a distance of several ten or above 100 m. The optical member 26 may have at least one optically effective surface 28. The optically effective surface may be convexly curved in order to provide the imaging function of the optical member 26 in direction of the y-axis as shown in FIG. 2B. The optically effective surface may be aspheric, in particular a conic section in a cross-section including the y-axis and the z-axis. The z-axis is the direction perpendicular to the x- and y-direction and is the light propagation direction towards the target area 16.

In other embodiments, the optical member 26 may be a GRIN (graded index) lens in order to provide the function of imaging the light emitted by the VCSELs in direction of the y-axis to generate the illumination lines.

In still other embodiments, the optical member 26 may be a meta-lens and thus can be configured as a thin planar optical element. A meta-material is a structure in the nanoscale regime. The structure provides a refractive index distribution which may be tailored to the desired optical function, for example imaging or diffusing. The transmissivity for electrical and magnetical fields of a meta-structure may deviate from the transmissivity of conventional lenses. Such meta-structures may comprise periodical, microscopically fine structures of electrically or magnetically effective materials, wherein such structures have a size of much less than the wavelength of the light emission of the VCSELs, e.g. even less than half of the wavelength, e.g. a quarter of the emission wavelength. If the optical member 26 comprises a meta-material or structure, the optical member 26 does not need a curved surface, but may be a thin plane-parallel element. Transformation of light is then based on the principle that the refractive index distribution of the meta-material influences the optical phase such that the desired optical transformation of the light passing through the meta-material is achieved to generate the densely packed illumination lines with little or no distortion.

In case of a "conventional" lens as the optical member 26, the optically effective surface 28 may be characterized by the radius of curvature of the surface 28, a conical constant k and/or aspherical constants of the surface. At least one of these parameters is optimized to achieve low distortion and the desired intensity profile in the target area. For example, the conical constant k may be approximately −1 (for the example of a lens material with a refractive index being 1.5 or close to that value) resulting in homogeneous irradiance on a flat screen. The radius of curvature may be adapted to image the VCSELs of the light source 10 to the scene or target area, or to collimate the light emitted by the VCSELs, if the target area is in large distances (optically in infinity).

As shown in FIG. 2C, the optically effective surface 28 of the optical member 26 is faceted in direction of the x-axis in order to produce the illumination lines with a smooth, in particular homogeneous intensity distribution.

An imaging of the individual VCSELs 22 in direction of the x-axis is unwanted. Therefore, the parameters radius of curvature and/or conical constant k and/or aspheric constants are designed in the x-axis direction to provide the desired intensity distribution in the target area in direction of the x-axis for e.g. homogeneous illumination. At least one of the afore-mentioned parameters of the optical member 26 in the x-axis direction differs from the corresponding parameter in the y-direction.

In FIG. 2C, which shows a portion of the optical element 26 in x-direction, black dots 30 represent one sub-set 24 in direction of the x-axis. The optical member 26 is faceted in direction of the x-axis, wherein the aperture size $D_x$ of each lens facet 32 in direction of the x-axis is smaller than the size $w_x$ of the sub-array 24 in direction of the x-axis.

The optically effective surface 28 may be designed in the x-direction, according to another approach, by starting with the same radius of curvature and conical constant as designed for the optically effective surface 28 in direction of the y-axis and designing the lens facet size $D_x$ to cover the desired $\alpha_x$ under the assumption that $D_x$ is homogeneously illuminated. As the sub-array size $w_x$ in the x-direction may strongly vary from the needed lens size $D_x$, the lens will not be homogeneously illuminated. Then the lens size $D_x$ and the radius of curvature in direction of the x-axis can be divided by the same number to make the lens facet size $D_x$ smaller, preferably much smaller than the sub-array size in direction of the x-axis. By dividing the radius of curvature by the same number as $D_x$, it is ensured that $\alpha_x$ is kept constant, while making the lens size $D_x$ much smaller than $w_x$ allows arrangement of several similar (preferably equal) lens facets in the direction of the x-axis. This ensures that most of the lens facets 32 are illuminated homogeneously and this grants a homogeneous distribution of a target intensity profile.

In direction of the x-axis, one or multiple lens facets 32 may be arranged in front of each sub-array zone (the length of a sub-array 24 in x-direction) in direction of the x-axis. In FIG. 2C, one lens facet 32 is arranged in front of each sub-array zone in direction of an x-axis. As mentioned before, each zone may have multiple rectangular shaped lens facets 32 arranged in direction of the x-axis. The lens facets 32 may be decentered with respect to the sub-array zones.

The optical member 26 may be arranged in a distance Z from the array 20 which equals the focal length $f_y$ of the optical member 26 in direction of the y-axis. With respect to the x-axis, the distance Z may be much larger than the focal length $f_x$ of the lens facets 32 in direction of the x-axis.

In case of such a distance Z of the optical member 26 from the array 20, $\alpha_L=w_y/f_y$, and $\alpha_x$ is proportional to $D_x/f_x$.

Figure 3A:
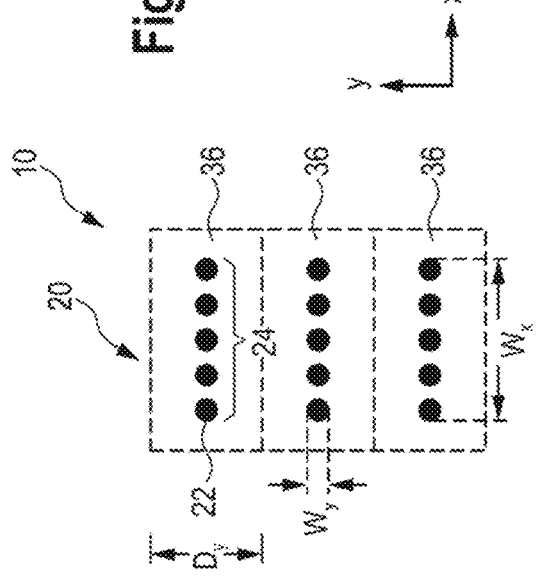
FIG. 3A shows a front view of another embodiment of a light source for generating an illumination pattern consisting of illumination lines.
Figure 3B:
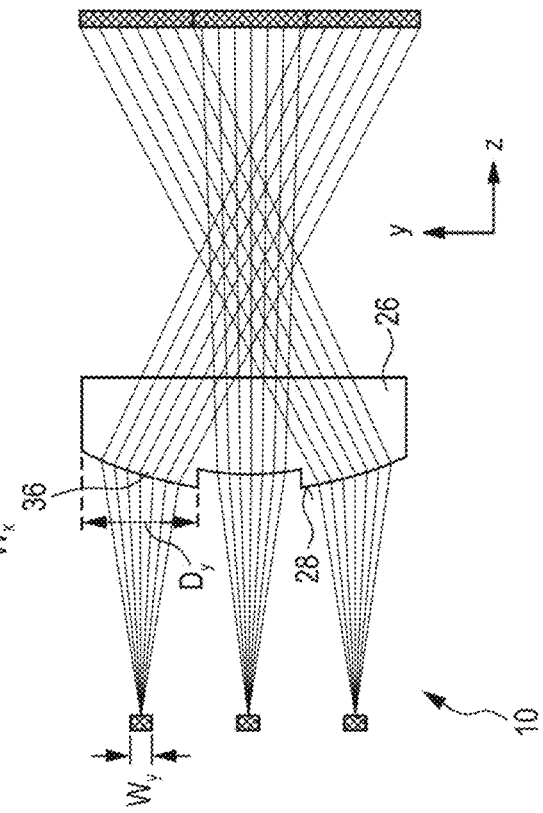
FIG. 3B shows a side view of the light source in FIG. 3A.
Figure 3C:
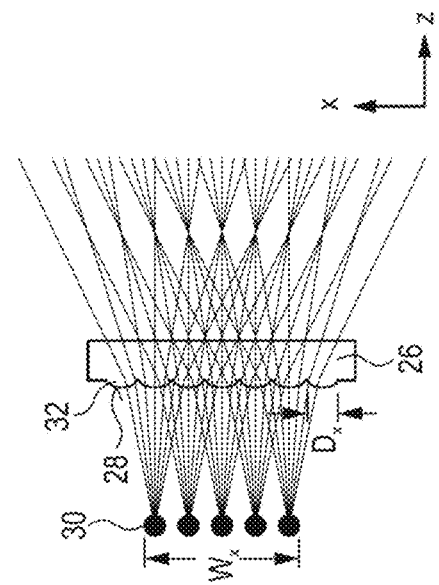
FIG. 3C shows a top view of the light source in FIG. 3A and FIG. 3B.

With reference to FIGS. 3A-3C, another embodiment of the light source 10 will be described. In the following, only the differences of the light source in FIGS. 3A-3C with respect to the light source 10 in FIGS. 2A-2C will be described.

The first difference is that the sub-arrays 24 of VCSELs 22 of the array 20 are displaced with respect to one another in direction of the y-axis only. Densely packed illumination lines may be generated in case of the array 20 by an optical member 26 which is faceted (number of facets >1, while the number of facets in y-direction of the optical element 26 in FIG. 2A-2C is 1) in direction of the y-axis, as shown in FIG. 3B. Thus, the optical member 26 has a plurality of lens facets 36 in direction of the y-axis. One lens facet 36 is arranged in front of each zone or sub-array 24 in direction of the y-axis. Each lens facet 36 may be decentered with respect to the individual sub-array 24. The facets 36 are configured to arrange the illumination lines 14 (FIG. 1) side-by-side and preferably close the gaps 18 between the illumination lines 14. Each lens facet may have a size $D_y$ which is large enough to cover a large fraction of the light emitted by the respective sub-array 24, preferably the full beam of light emitted by the respective sub-array 24.

In direction of the x-axis, the optically effective lens surface 28 may be designed in a similar way as in the optical member 26 in FIG. 2C. In FIG. 3C, $w_x$ denotes the size of one VCSEL sub-array in x-direction and $D_x$ is the lens aperture size of one lens facet 32. Again, $D_x$ may be much smaller than $w_x$.

It is to be understood that the optical transformation function of the optical member 26 shown in FIGS. 3B and 3C can also be achieved by using a meta-material or diffractive optical element instead of the curved surface 28. In case of a meta-lens, the facets 36 may be portions of the meta-lens with different refractive index distributions, but the lens itself may have plane surfaces.

The lens facets 36 of the optical member 26 may have different radius of curvature and/or different conical constants and/or different aspherical constants.

Figure 4:
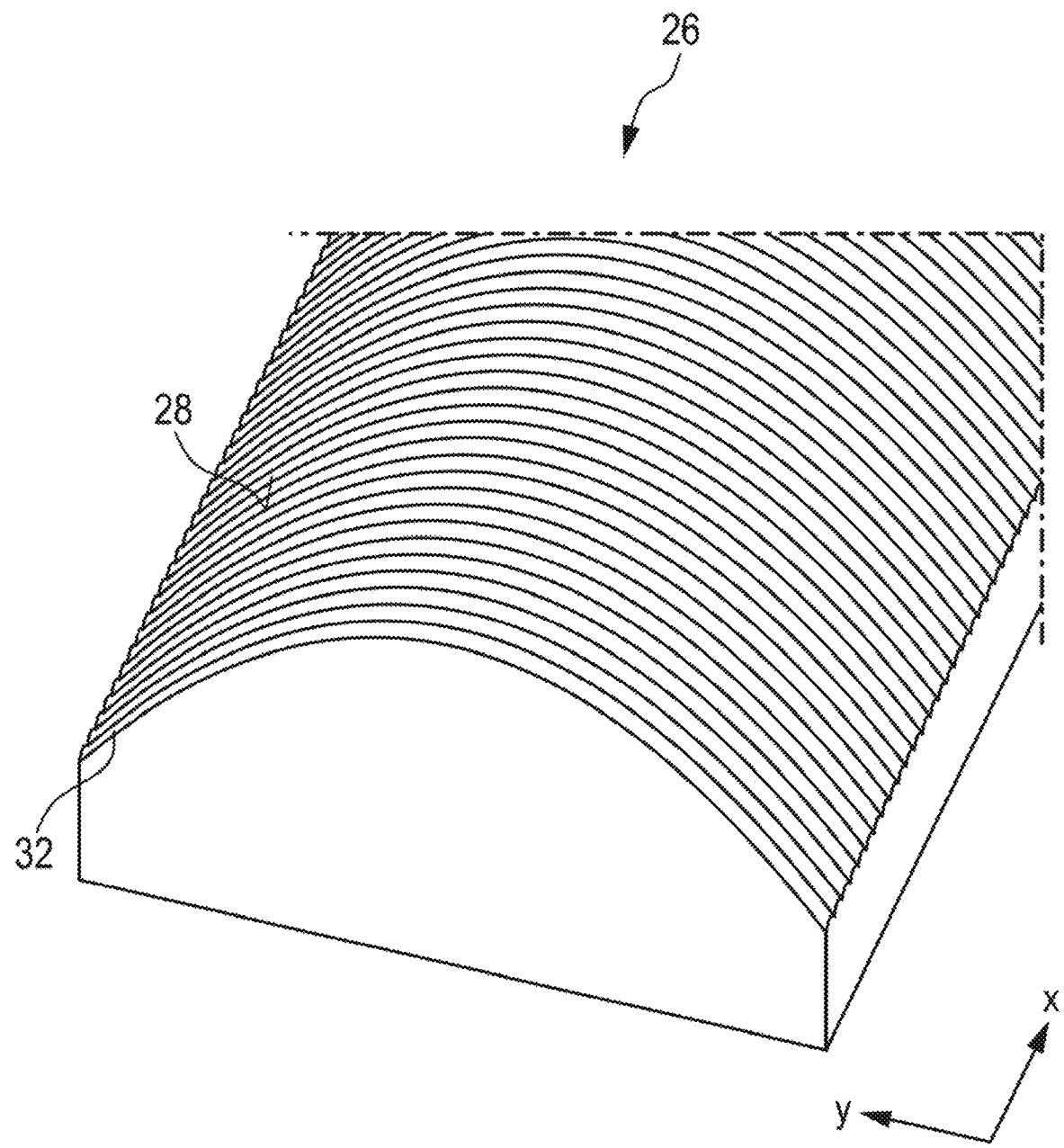
FIG. 4 shows a perspective view of a portion of an embodiment of an optical member for use in a light source as shown e.g.

FIG. 4 shows a perspective view of the optical member 26 in FIGS. 2B and 2C. As can be seen in FIG. 4, the optically effective surface 28 comprises a multitude of lens facets 32 arranged side-by-side in direction of the x-axis. In direction of the y-axis, the optically effective surface 28 is aspheric and can be described as a conic section in the y-z-plane. In y-direction, the optically effective surface 28 may be considered as comprising one facet. The optical member 26 comprises an overall or global surface profile (regardless of the lens facets 32) in the x-direction, which may be curved in the x-direction, e.g. aspheric, in particular conic if such a curvature is suitable to avoid distortion in the illumination line. Thus, the optical member 26 may be a bi-conic lens, i.e. conic in x- and conic in y-direction. The radius of curvature in x-direction may differ from the radius of curvature in the y-direction which typically may be smaller than the radius of curvature in the x-direction. Alternatively or additionally, a conical constant and/or aspheric constants of the surface 28 may differ between the x-direction and the y-direction.

Figure 5:
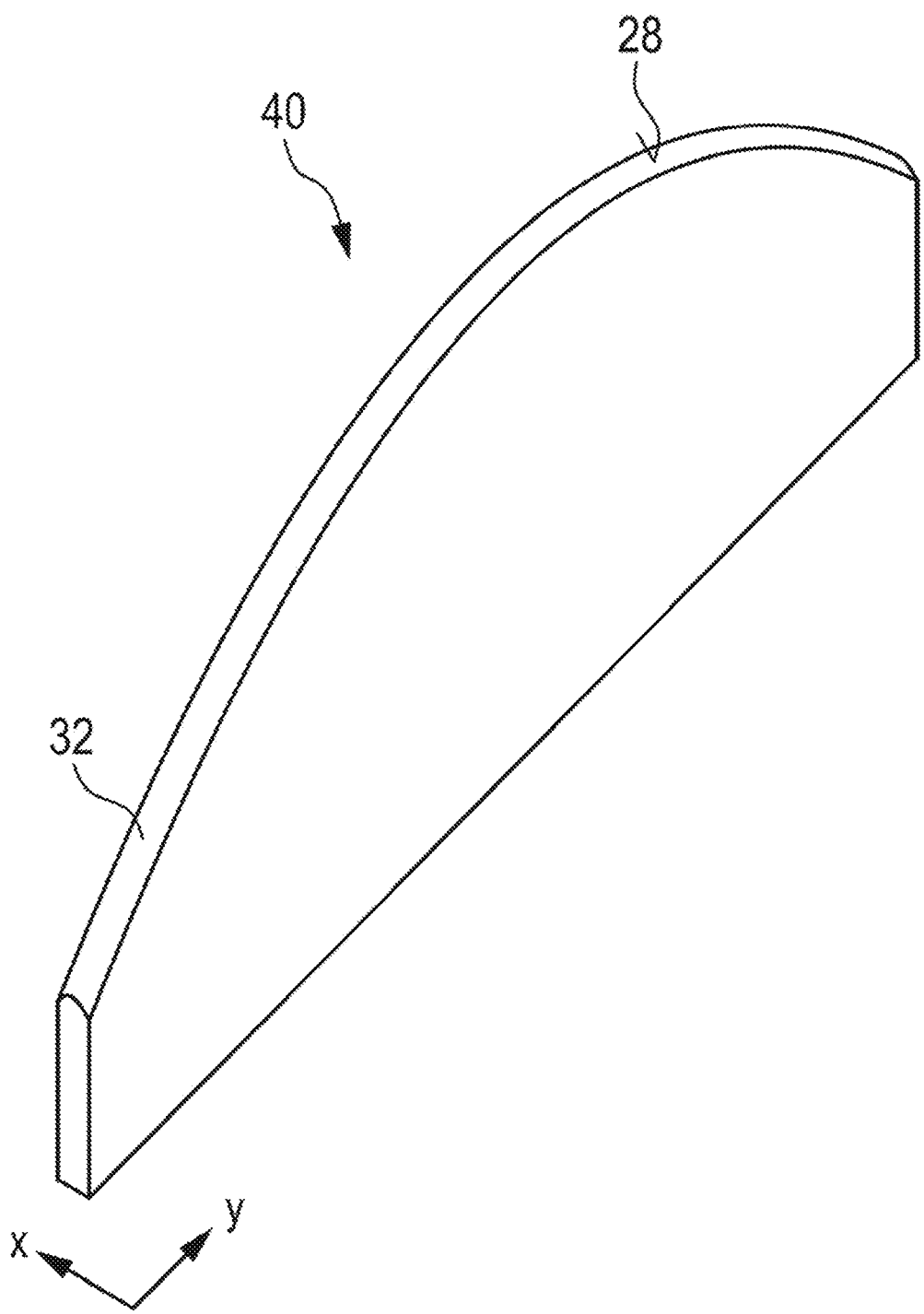
FIG. 5 shows a perspective view of a unit cell of the optical member in FIG. 4.

FIG. 5 shows a unit cell 40 of the optical member 26 in FIG. 4, i.e. a single lens facet 32, wherein the lens facet 32 has an aspheric surface in y-direction with a radius of curvature which is much greater than the surface curvature of the single lens facet 32 in x-direction.

Figure 6:
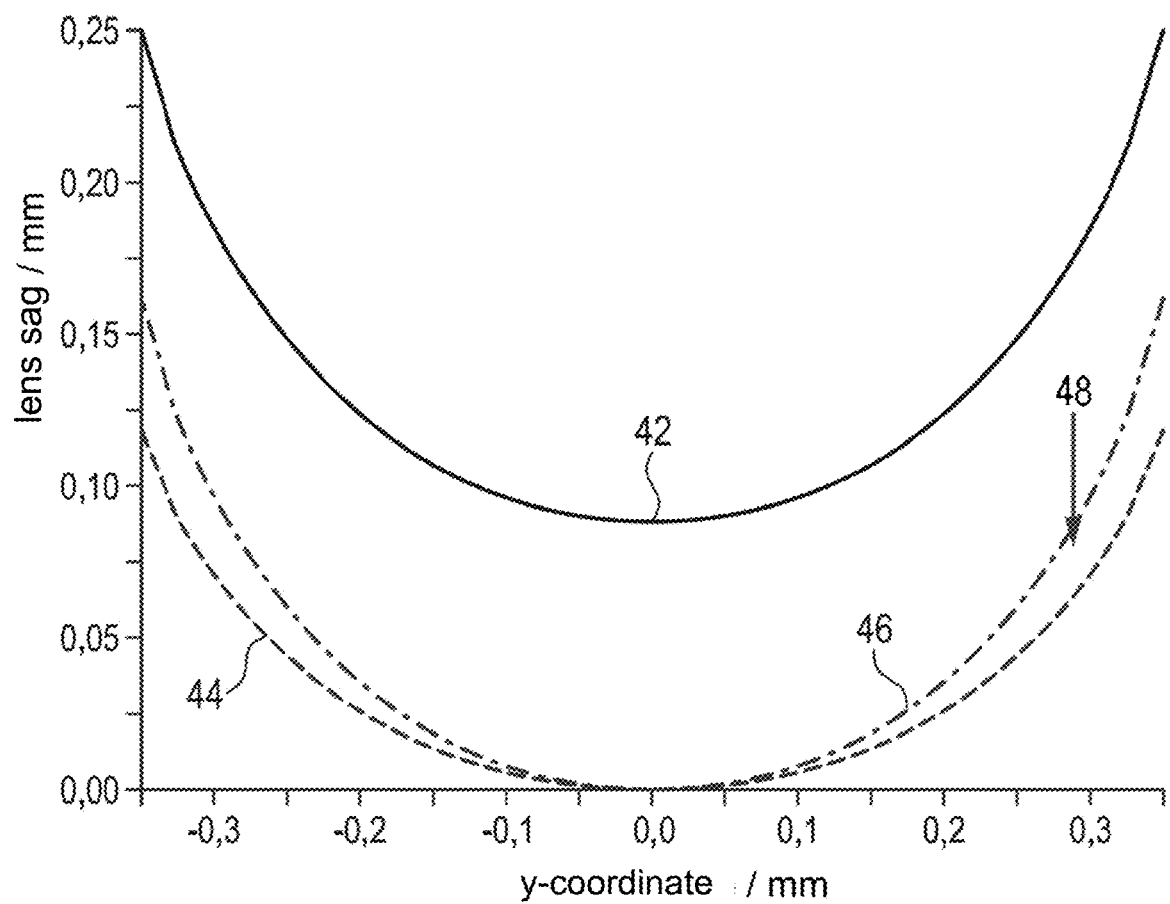
FIG. 6 shows an example diagram of a lens sag profile of the optical member in FIG. 4.

FIG. 6 shows an example of a lens sag profile of the optical member 26 in FIG. 4. A curve 42 represents the lens height profile at an edge of the optical member 26, and a line 44 represents the lens height profile at the center of the lens. The curve 46 represents the curve 42 with its minimum aligned to the curve 44 as indicated by an arrow 48.

Figure 7:
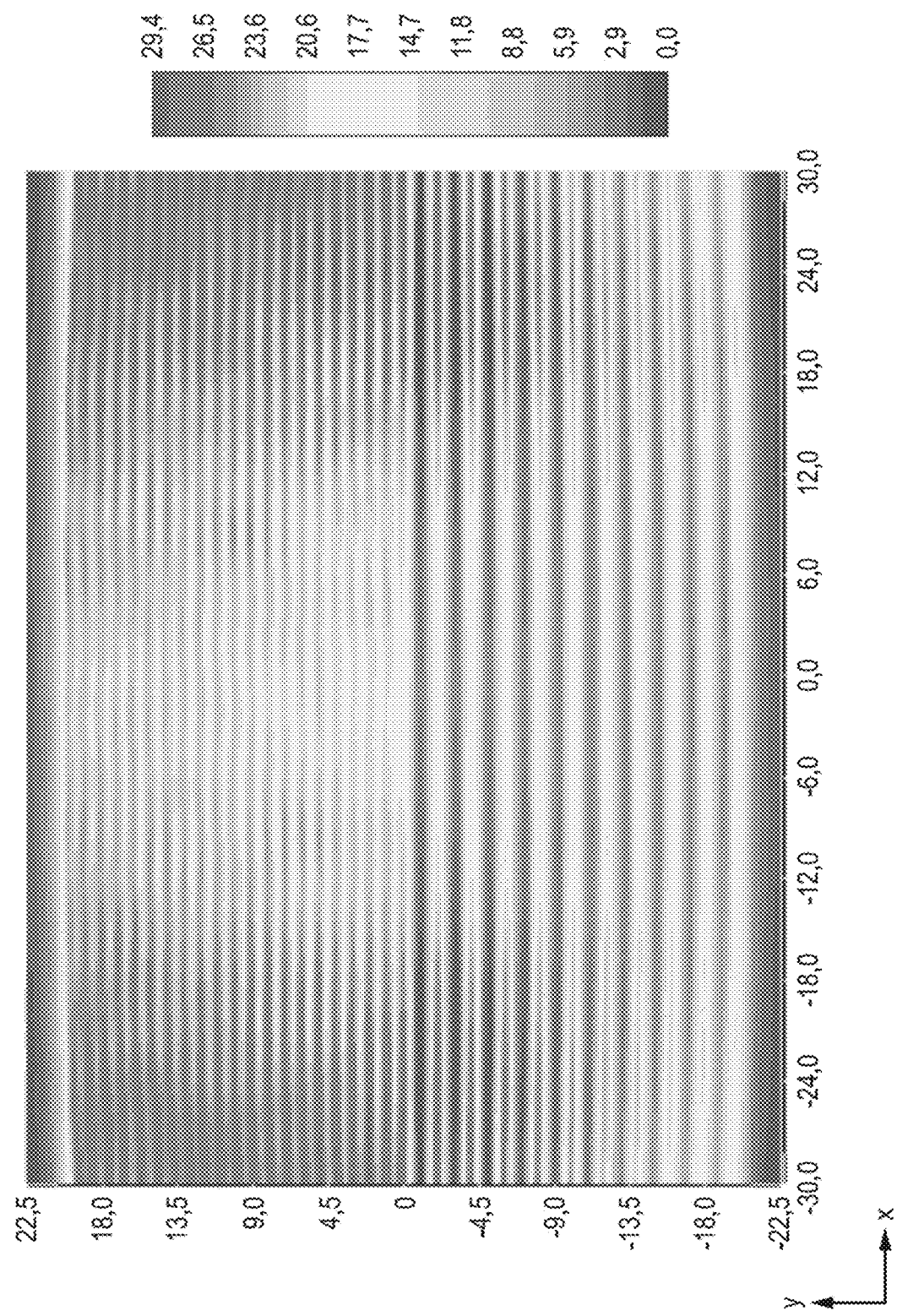
FIG. 7 shows a simulation of an illumination pattern consisting of illumination lines.

FIG. 7 shows a simulation of an illumination pattern comprising 40 illumination lines in total. Thus, the light emission of 40 sub-arrays of VCSELs are imaged as individual illumination lines in the direction of the y-axis. At the left margin of the graph, the numbers represent an y-coordinate value (in arbitrary units), and the numbers of the bottom of the graph represent an x-coordinate of the illumination field. The scale on the right side of the graph represents the (incoherent) irradiance in the illumination field spanned by the illumination lines. In direction of the y-axis, the 40 sub-areas are imaged as individually addressable illumination lines, while in direction of the x-axis, the optical member (like optical member 26) acts as a diffusor tailoring the irradiance in direction of the x-axis to be homogeneous or even slightly increasing towards the large angles, which may be beneficial for compensating for optical losses of a transceiver system, in which the light source 10 may be used.

A numeric example for a light source 20 to obtain an illumination line pattern like that in FIG. 7 using an optical element 26 like that in FIG. 4 may be as follows:

viewing angle in x-direction $\alpha_x=60°$; $w_x=0.64$ mm (20 VCSELs with 32 μm pitch;); optical element 26 in FIG. 4: radius of curvature in x-direction $ROC_x=0.006$ mm; conical constant in x-direction $k_x=-1$; size of a single facet in x-direction $D_x=0.02$ mm; number of facets in x-direction>=40;

viewing angle in y-direction $\alpha_y=45°$; $w_y=10$ μm (only one VCSEL per sub-array in y-direction); 40 sub-arrays in y-direction with 10 μm center-to-center distance for each sub-array in y-direction); optical element 26 in FIG. 4: radius of curvature in y-direction $ROC_y=0.25$ mm; conical constant in y-direction $k_y=-1$; $D_y=0.7$ mm, number of facets in y-direction=1 (in this case, $D_y$ denotes the size of the optically effective surface of optical element 26).

In the lower half of the graph shown in FIG. 7, only each second illumination line is activated to indicate the separation of the zones. The rectangular shape of the illumination lines with low distortion in the corners is clearly visible in FIG. 7.

Figure 8:
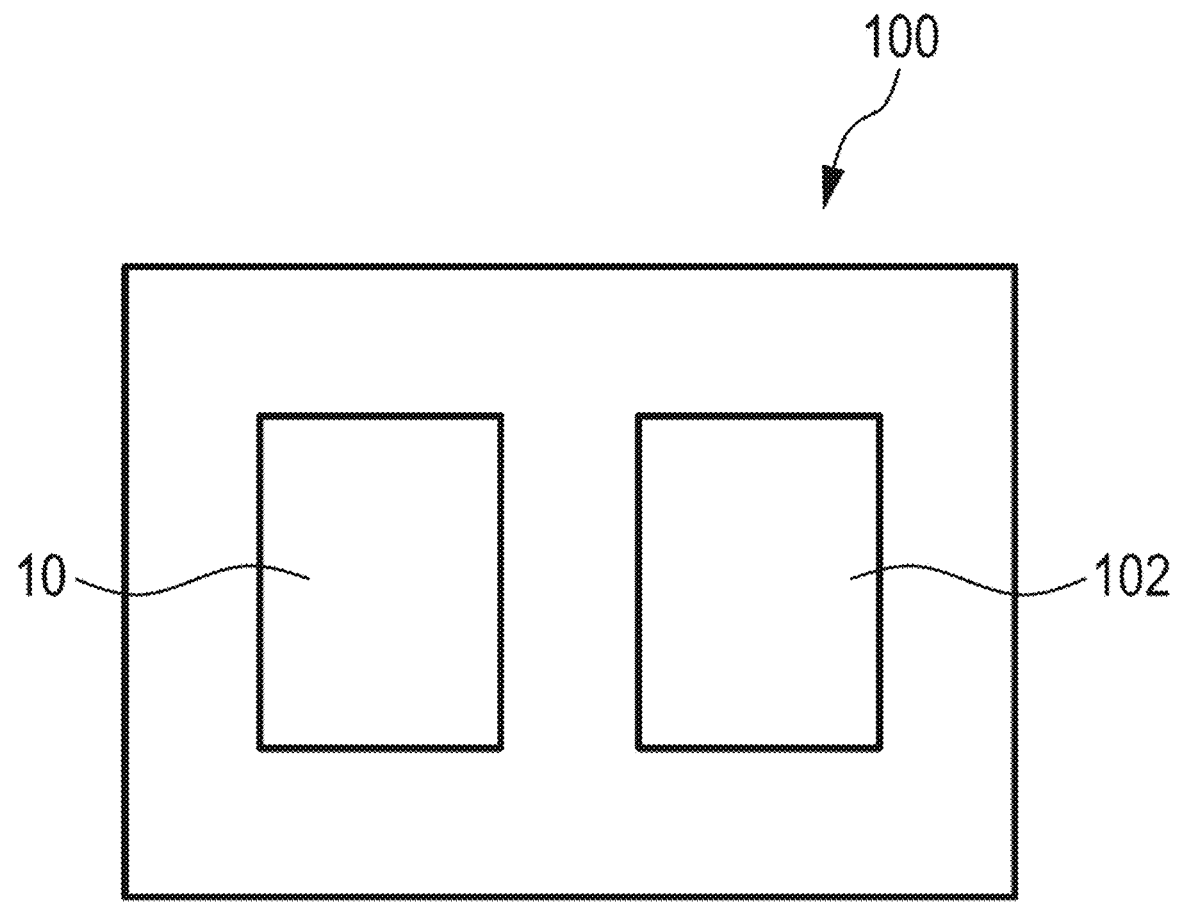
FIG. 8 shows a sketch of a sensor.

FIG. 8 shows a sensor 100, which comprises the light source 10 according to any of the embodiments described above. The sensor further comprises a detector 102 for detecting light emitted by the light source and reflected or scattered from the target area. The detector 102 may be any kind of light detecting means, like a photodiode. The sensor 100 may be integrated in a hand-held device, e.g. a smart phone, a tablet or the like.

A method of illuminating a scene may be carried out by a light source according to any of the embodiments described above. The method comprises providing a light source according to any of the embodiments described above. The method further comprises causing at least one of the sub-arrays to emit light. The method further comprises transforming the light emitted by the at least one sub-array into an illumination line in a target area, the illumination line having a width in direction of the first axis and a length in direction of a second axis perpendicular to the first axis, wherein the width is smaller than the length. Transforming the light can be carried out by the optical member 26 as described above.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A light source comprising:
    an array of Vertical Cavity Surface Emitting Lasers (VCSELs), the array comprising at least two sub-arrays, each sub-array comprising at least one VCSEL, the sub-arrays being displaced with respect to one another along a first axis (y), the sub-arrays being configured to individually emit light independent from light emission of the other sub-array or sub-arrays, and
    an optical member configured as a single optical element and configured to transform light emitted by the sub-arrays into substantially parallel illumination lines in a target area, wherein the illumination lines are arranged along the first axis (y), each illumination line having a width in a direction of the first axis (y) and a length in a direction of a second axis (x) perpendicular to the first axis (y), wherein the width is smaller than the length, wherein the optical member has facets in the direction of the second axis (x), wherein each facet has a size in the direction of the second axis (x) which is smaller than a size of a sub-array in the direction of the second axis (x), wherein the optical member is configured as an imaging lens or collimating lens in the direction of the first axis (y), and as a diffusor in the direction of the second axis (x).

2. The light source of claim 1, wherein the optical member is configured to generate the illumination lines with homogeneous light intensity distribution in the direction of the second axis (x).

3. The light source of claim 1, wherein the optical member is configured to generate the illumination lines with a light intensity distribution increasing towards ends of the illumination lines in the direction of the second axis (x).

4. The light source of claim 1, wherein the optical member has an optically effective surface, with a surface shape in a cross-section along a plane including the first axis (y) and a third axis (z) perpendicular to the first and second axes (x, y) is aspheric.

5. The light source of claim 4, wherein the surface shape is a conic section.

6. The light source of claim 4, wherein the surface shape of the optically effective surface differs in the direction of the first axis (y) from the surface shape in the direction of the second axis (x) with respect to at least one of radius of curvature, conical constant, or aspheric constants.

7. The light source of claim 1, wherein the sub-arrays are displaced with respect to one another along the second axis.

8. The light source of claim 1, wherein the optical member comprises first facets arranged along the direction of the first axis (y), wherein each first facet of the optical member transforms light emitted by one of the sub-arrays with respect to the first axis (y).

9. The light source of claim 8, wherein the first facets are decentered with respect to the sub-arrays in the direction of the first axis (y).

10. The light source of claim 1, wherein the optical member is arranged in a distance from the sub-arrays in a direction of light emission, the distance substantially equals to a focal length of the optical member with respect to light transformation with respect to the first axis (y) and is greater than a focal length of the optical member with respect to light transformation with respect to the second axis (x).

11. The light source of claim 1, wherein the optical member comprises a diffractive optical element, a GRIN lens, or a meta-lens.

12. The light source of claim 1, wherein the array comprises at least five sub-arrays.

13. The light source of claim 1, wherein each sub-array comprises at least two VCSELs arranged along the second axis (x).

14. A sensor, comprising:
    a light source of claim 1 and
    a detector for detecting light emitted by the light source and reflected or scattered from the target area.

15. A method of illuminating a scene, comprising:
    providing a light source according to claim 1, and
    causing at least one of the sub-arrays to emit light.

* * * * *